United States Patent [19]

Sala

[11] Patent Number: 4,950,128

[45] Date of Patent: Aug. 21, 1990

[54] AUTOMATIC LOADING UNIT FOR SHEET UNITS ONTO MACHINES EQUIPPED WITH A CONVEYOR

[75] Inventor: Sergio Sala, Trezzo Sull'adda, Italy

[73] Assignee: Telmec S.p.A., Trezzano Rosa, Italy

[21] Appl. No.: 267,959

[22] Filed: Nov. 7, 1988

[30] Foreign Application Priority Data

Nov. 9, 1987 [IT] Italy .............................. 22568 A/87
Oct. 25, 1988 [IT] Italy .............................. 22413 A/88

[51] Int. Cl.$^5$ ............................................. B65H 5/00
[52] U.S. Cl. ................................. 414/796.9; 271/12; 271/30.1; 271/106; 198/468.4; 198/468.6
[58] Field of Search ............... 271/5, 12, 30.1, 90, 271/91, 105, 106, 264, 267; 414/796.5, 796.9, 797, 797.1, 917, 737; 198/468.4, 468.6, 468.01, 463.2; 901/7

[56] References Cited

U.S. PATENT DOCUMENTS

| | | | |
|---|---|---|---|
| 3,283,918 | 11/1966 | Devol ............................ | 414/728 X |
| 3,411,640 | 11/1968 | Wallis ............................ | 271/12 |
| 3,665,148 | 5/1972 | Yasenchak et al. ............... | 901/7 X |
| 3,740,029 | 6/1973 | Bays ............................. | 271/90 X |
| 3,750,804 | 8/1973 | Lemelson ........................ | 414/278 X |
| 3,797,676 | 3/1974 | McCarthy ....................... | 414/917 X |
| 3,888,359 | 6/1975 | Moline .......................... | 271/267 X |
| 3,958,682 | 5/1976 | Martin .......................... | 901/7 X |
| 3,964,953 | 6/1976 | Mitchard et al. ................ | 271/91 X |
| 4,609,324 | 9/1986 | Sphar ........................... | 414/737 X |
| 4,732,376 | 3/1988 | Umezawa ........................ | 271/267 |
| 4,772,006 | 9/1988 | Guglielmetti et al. ............ | 271/106 X |

FOREIGN PATENT DOCUMENTS 3132393 10/1982 Fed. Rep. of Germany ........ 271/91
245640 5/1987 Fed. Rep. of Germany ........ 901/7
745812 7/1980 U.S.S.R. ........................ 198/463.2

OTHER PUBLICATIONS

AT&T Technologies Technical Digest #75, Adjustable Vacuum-Type Pickup Head for Handling Substrates, Sep. 1984, Maserala.

Western Electric Technical Digest #26, Feed Mechanism for Printed Circuit Boards, Apr. 1972, Aycock, T. L. and Hetherington, J. C.

Primary Examiner—Robert J. Spar
Assistant Examiner—James T. Eller, Jr.
Attorney, Agent, or Firm—Herbert Dubno

[57] ABSTRACT

A unit for the automatic loading of sheet units onto functional machines equipped with a conveyor which comprises a base frame which can be moved on corresponding rails along a track parallel to the direction of advance of the conveyor member of the machine to which the unit is connected, and a frame bearing one or more members for picking up sheet units, transported by the base frame, equipped with elements for movement comprising elements effecting horizontal lateral movement in a direction perpendicular to the direction of movement of the base frame and element effecting vertical displacement together achieving a displacement between a pick-up position over an area in which sheet units are accumulated and a setting-down position overlying the conveyor in which extreme positions the picked up sheet unit lies substantially horizontal with an intermediate position in which the sheet unit picked up lies in an inclined position, together with controllable elements for translational coupling between the conveyor member and the first frame.

13 Claims, 9 Drawing Sheets

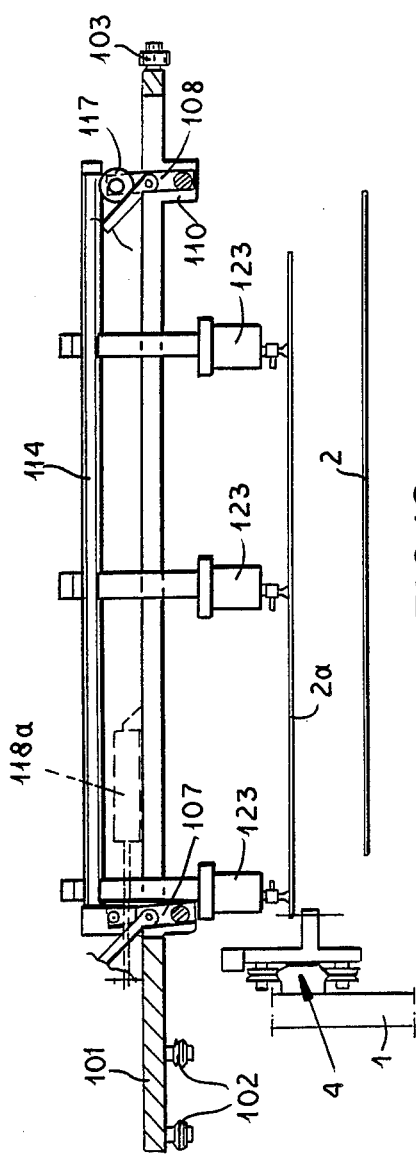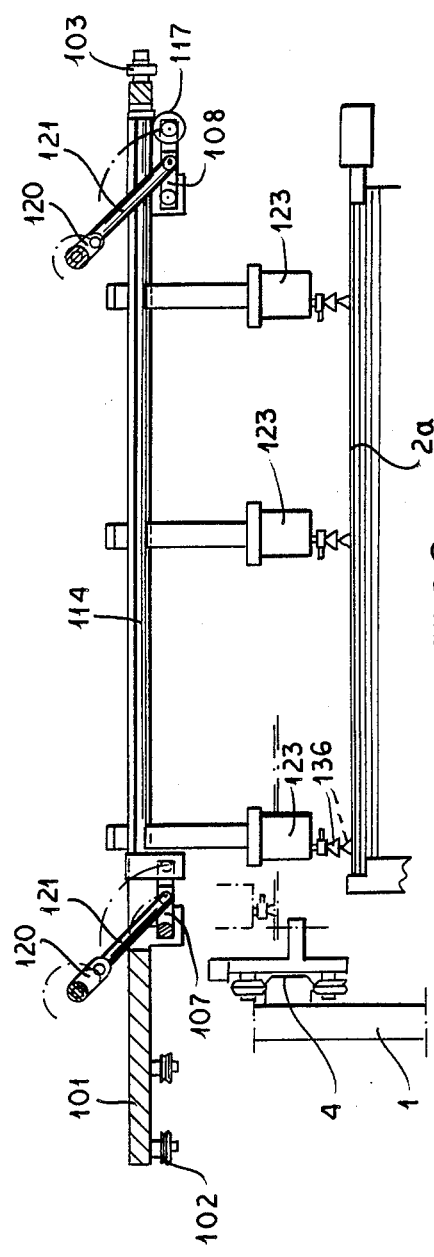

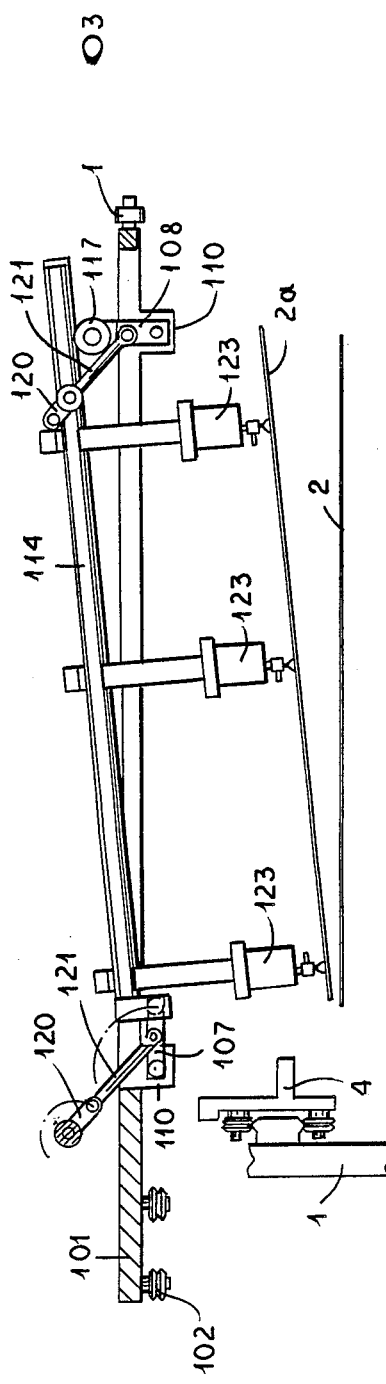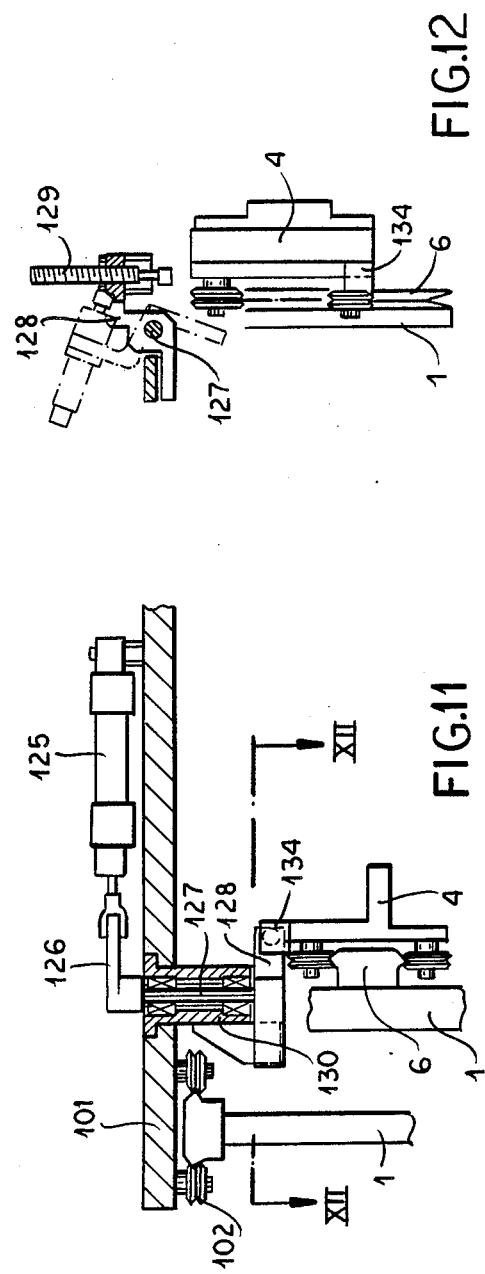

AUTOMATIC LOADING UNIT FOR SHEET UNITS ONTO MACHINES EQUIPPED WITH A CONVEYOR

FIELD OF THE INVENTION

This invention relates to a unit for the automatic loading of sheet units onto functional machines equipped with a conveyor.

BACKGROUND OF THE INVENTION

When multiple operations are performed on sheet or flat plate objects of various dimensions, in particular in the production of printed circuits for electronic equipment, there is a need to perform operations on the objects themselves by machines of various kinds, hereinafter referred to in brief as functional machines. Such machines can have a conveyor member capable of transferring the objects in question, hereinafter generically referred to as sheet units or sheets through the working components of the machine in question. There is a need to load these sheet units onto such a conveyor from a cumulative collection of the sheets, normally in the form of a stack.

This loading may be performed manually, but in order to obtain greater productivity it is desirable to use an automatic device which performs the operation independently.

For this purpose it is frequently necessary to place the sheets in precise positions on the machine's conveyor, for example so that they engage with centering or securing means on the conveyor, such as pins, stop surfaces and the like, so as to convey the sheets through the machine in a geometrically precise position required by the intended operation.

In order to pick up the top sheet from a stack of sheets it is convenient to use pick-up members which sieze the upper surface of the sheet, for example by means of suction cups. In most cases this ensures that only one sheet is picked up, without interference from those beneath the lifted sheet.

However in some cases, particularly if the sheets have very smooth surfaces which fit together, it is possible that atmospheric pressure acting on the underside of the sheet below the top sheet which is to be picked up causes this sheet to remain attached to the top sheet, with an effect similar to that of a suction cup, thus causing it to be picked up together therewith.

A similar effect may also be due to the presence of lubricant or moisture between stacked sheets, or adhesion phenomena between the materials forming the sheets, or the like, depending upon the type of sheet in question.

This disadvantage, which can easily be overcome in manual operations, becomes a source of severe problems in the case of an automatic feed, because if it is not detected it results in the surplus sheet or sheets being dropped in an incorrect position before being deposited on the conveyor, or delivery to the machine of two or more stacked sheets, generally causing the machine to jam.

OBJECTS OF THE INVENTION

It is therefore, an object of the invention to provide equipment which is; capable of feeding sheet units automatically to the conveyor member of a machine which is designed to perform operations on these units, setting down each individual unit in a precisely defined position on the conveyor member, and also designed to avoid simultaneously picking up two or more adhering sheets.

These objects are accomplished by this invention which provides an automatic unit for loading sheet units onto functional machines equipped with a conveyor comprising a base frame which can be moved on corresponding rails along a track parallel to the direction of advance of the conveyor member of the machine to which the unit is connected, and a frame bearing one or more members for picking up sheet units, transported by the base frame, equipped with means for movement comprising means for horizontal lateral movement in a direction perpendicular to the direction of movement of the base frame and means for vertical displacement, together effecting displacement from a pick-up position overlying an area in which sheet units are accumulated and a setting-down position overlying the conveyor, in which extreme positions the sheet unit picked up lies substantially horizontal, with an intermediate position in which the sheet unit picked up lies in an inclined position, together with controllable means for translational coupling between the conveyor member and the first frame.

In greater detail, in one embodiment of the invention the unit comprises a first frame which can be moved on corresponding rails along a track parallel to the direction of advance of the conveyor member of the machine to which the unit is connected, on which first frame lies a second frame, connected thereto in a slidable manner perpendicular to the direction of advance of the conveyor, which can be moved by corresponding actuator means between a pick-up position overlying an area in which sheet units are accumulated and a setting-down position overlying the conveyor, with a third frame supported on the second frame and slidable by means of a corresponding actuator having cam means for the support and vertical movement of a fourth frame, integral in the horizontal plane with the second frame and movable in a vertical direction, bearing one or more means for picking sheet units, these cam means determining the vertical movement of the two ends of the fourth frame at successive times.

The first frame and the second frame are flat units of substantially rectangular shape having central openings, between which openings the fourth frame bearing the pick-up members can move vertically.

The fourth frame is connected to the second frame by means of at least one connecting rod, which can move in the vertical plane, which is able to link the fourth frame with the first frame in the horizontal plane and cause it to move in a vertical direction.

Within the unit according to the invention there are elastic means connecting the first frame and a fixed point on the machine with which the unit is associated, acting on the first frame against the conveyor member when connected therewith.

The third frame is supported by the second frame in a movable manner parallel to the direction of movement of the second frame on the first frame, with corresponding actuator means, and has four cam profiles, in identical parallel pairs aligned in the direction of movement of the frame, on which rest the corresponding supporting rollers for the fourth frame, these cam profiles each having a low portion and a high portion in the direction of movement of the sheet connected by an oblique portion, movement of the third frame governing passage of the fourth sheet from the support position on the lower portions of the cams to the support position of the fourth frame on the higher portion of the cams.

The cam profiles positioned by the same member in the direction of movement of the third frame are provided with a lower portion of different extent from that of the profiles on the opposite side, the rollers of the fourth frame passing from the low position to the high position at successive times from one part of the said frame with respect to the other during movement of the third frame.

The controllable translational coupling means between the conveyor member and the first frame consist of a stop pin located at the end of an actuator supported in a predetermined position on the first frame which is capable of entering into contact with a corresponding pulling surface of the conveyor member when the actuator is in the extended position and of releasing itself from this contact when the actuator is in the retracted position.

In an alternative embodiment the automatic unit for loading sheet units onto functional machines equipped with a conveyor comprises a first flat frame, lying horizontally, which can move on corresponding rails parallel to the direction of advance of a conveyor member of a machine with which the loading unit is associated, this first frame being provided with a central opening within which are located two cross-members which rotate around axes parallel to the direction of advance of the conveyor member, the cross-member closest to the conveyor member being connected by means of an articulated joint, having its axis offset from the axis of rotation of the cross-member itself, to one end of a second frame bearing one or more members for picking up a sheet unit, the opposite end of the second frame resting slidably on the other cross-member in a position offset from the axis of rotation thereof, together with actuators which rotate independently of the cross-members through a predetermined angle moving the frame carrying the pick-up members linked by articulation to the cross-members vertically and horizontally between a pick-up position overlying an area in which sheet units are stacked and a setting-down position overlying the conveyor, together with controllable means for translational coupling between the conveyor member and the first frame.

In particular the first frame is a flat member of substantially rectangular shape having a central opening within which are rotatably mounted the cross-members bearing the second frame.

The actuators causing rotation of the cross-members may be rotating actuators each connected by means of a crank and connecting rod transmission to the corresponding cross-member, or linear actuators connected to the cross-members by appropriate transmission means to effect their rotation through the desired angle.

Sensors of the rotation of a cross-member which determine when rotation through a predetermined arc has been effected are also provided, and these sensors are capable of controlling the movement of the actuator for the other cross-member.

The controllable means for translational coupling between the conveyor member and the first frame consist of an arm borne radially by a shaft rotating above a vertical axis, controlled in rotation between two positions, one engaging a stop member carried by a movable component of the conveyor, thus rendering the frame integral with the conveyor, and the other allowing free movement of the conveyor.

BRIEF DESCRIPTION OF THE DRAWING

The above and other objects, features and advantages of my invention will become more readily apparent from the following description, reference being made to the accompanying highly diagrammatic drawing in which:

FIG. 8 is a cross-section taken along line VIII—VIII in FIG. 6;

FIG. 9 is the cross-section of FIG. 8 in the first stage of picking up;

FIG. 10, is the cross-section of FIG. 8 in the stage of setting down a sheet onto the conveyor;

FIG. 11, is a cross-section taken along line XI—XI of FIG. 6;

FIG. 12 is a section along line XII—XII in FIG. 11; and

SPECIFIC DESCRIPTION

Figure 1:
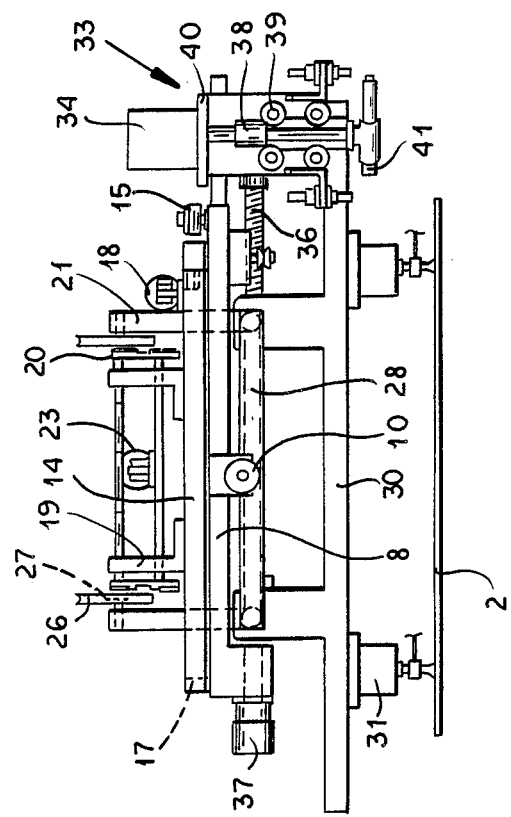
FIG. 1 is a side view of the entire feeder unit according to the invention, in a first embodiment.
Figure 2:
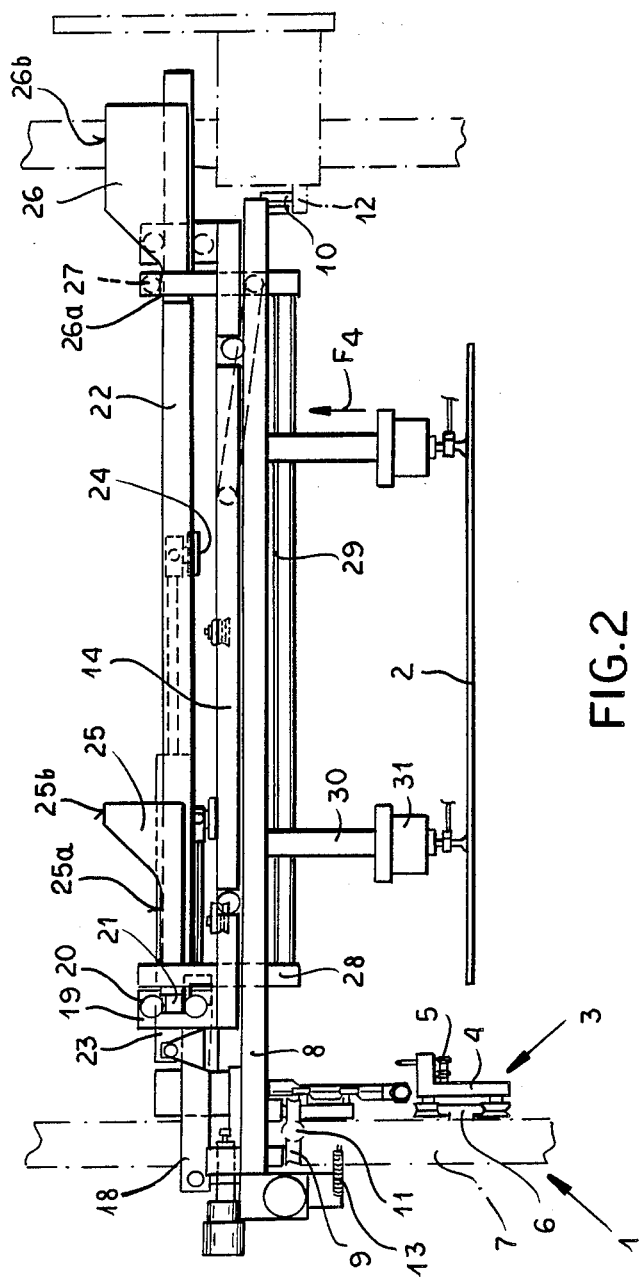
FIG. 2 is a front view of the unit in FIG. 1.

As FIGS. 1–5 show, the automatic loading unit according to the invention is applied to a functional machine 1 which is designed to perform operations on sheet units 2, for example printed circuits, conveyed through it by means of a conveyor member 3, consisting for example, as illustrated in FIG. 2, by a carriage 4 which is capable of securing and conveying the sheet unit, drawn by a chain 5 and sliding on a track 6 mounted on the frame 7 supporting functional machine 1.

Figure 3:
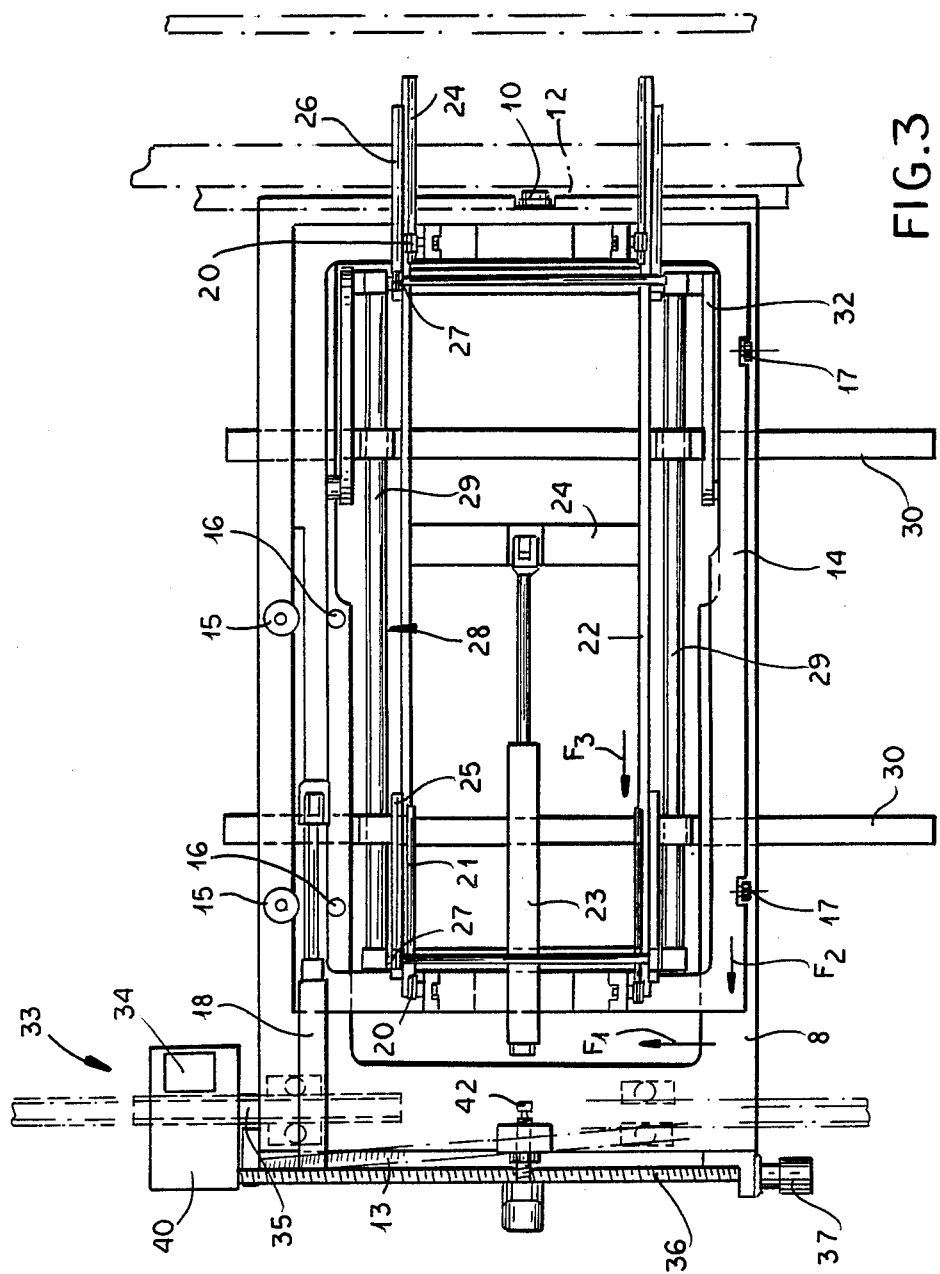
FIG. 3 is a plan view of the unit of FIG. 1.

The automatic loading unit according to the invention, in a first embodiment illustrated FIGS. 1 to 5, consists of a first frame 8, of substantially rectangular shape, which can move on corresponding rollers 9, 10 on guide rails 11, 12 mounted on frame 7 supporting the functional machine, having a direction parallel to the direction of advance of conveyor member 3, indicated by $F_1$ in FIG. 3.

Elastic means, such as spring 13, secure first frame 8 to carrying frame 7, holding frame 8 in a rearward position with respect to the direction of advance of conveyor 3.

Above first frame 8 lies a second frame 14, which can slide over frame 8 guided and supported by rollers 15, 16, 17, moving in a direction at right angles to the direction of advance of conveyor member 3 and the direction of movement of first frame 8, as indicated by arrow $F_2$ in FIG. 3.

Frame 14 is also linked to first frame 8 by means of an actuator 18, which is for example operated pneumatically, whereby frame 14 may be moved from a pick-up position above a stack of sheets 2, from which the first sheet is to be picked up, to a setting-down position over conveyor member 3, in line with the corresponding means which hold sheet 2 in position, consisting for example of pins which engage corresponding holes in the said sheets.

Second frame 14 is equipped with two pairs of supports 19, each of which bear two vertically aligned grooved rollers 20 between which the guide sections 21 of a third frame 22 are slidably supported and can move between these grooved rollers 20 parallel to the direction of movement of the second frame 14 as indicated by arrow $F_3$ in FIG. 3. Movement of frame 22 is determined by a corresponding actuator 23, for example of the pneumatic type, connected at one end to frame 14 and at the other end to cross-member 24 of the third frame 22.

Frame 22 is provided with two pairs of profiled cams 25, 26, placed at the ends of the frame, of a stepped shape and having corresponding low portions 25a, 26a and high portions 25b, 26b connected by oblique ramps. On these cams a fourth frame 28, equipped with a pair of parallel bars 29 on which cross-members 30 bearing the suction cup pick-up units 31 are mounted, is supported by means of corresponding rollers 27.

Cross-members 30 may be placed on parallel bars 29 in the desired position, and in the same way the linking position of pick-up units 31 on cross-member 21 may be preselected so that the pick-up units are located in the most convenient arrangement on the upper surface of sheet 2 which is to be picked up.

Frame 28 is also connected to frame 14 by means of a pair of tie bars 32 which provide a linkage in the direction of movement of frame 14, thus ensuring that frame 28 and frame 14 move together as a unit under the effect of actuator 18, at the same time effecting movement of the fourth frame in a vertical direction as shown by arrow $F_4$ in FIG. 2.

First frame 8 is also provided with an engaging unit 33 which is capable on command of linking this frame with conveyor 3.

As shown in FIGS. 1 and 3 engaging unit 33 consists of an actuator 34 bearing a shaft 35 which is integral with frame 8 and can be adjusted in position thereupon by means of a threaded rod 36 equipped with a corresponding knob 37.

Actuator 34 has a shaft 38, which can slide with roller guide 39 carried by plate 40 between actuator 34 and shaft 35 which carries stop pin 41 at its end so as to come into contact with carriage 4 making frame 8 integral therewith in its movement.

The unit according to the invention operates by starting with first frame 8 in a rearward position and second frame 14 which overlies it in a pick-up position above a stack of sheets 2, from which the top sheet is to be removed, as described previously.

Sheet stack 2 is supported by a constant level elevator unit of a known type, which is therefore not described in detail.

Third frame 22 lies in a forward position such as to maintain wheels 27 resting on the low portions 25a, 26a of cam profiles 25, 26.

From this position a sheet or printed circuit 2 is picked up by the suction cup pick-up units 31 acting on its surface; actuator 23 is then operated causing third frame 22 to move into a rearward position. During this movement cam profiles 26, having a low portion 26a of lesser extent, cause the corresponding end of frame 28 to rise, resting thereupon, before raising the opposite end, resting on sections 25, which reaches the raised position in a subsequent stage of the movement of frame 28.

Figure 4:
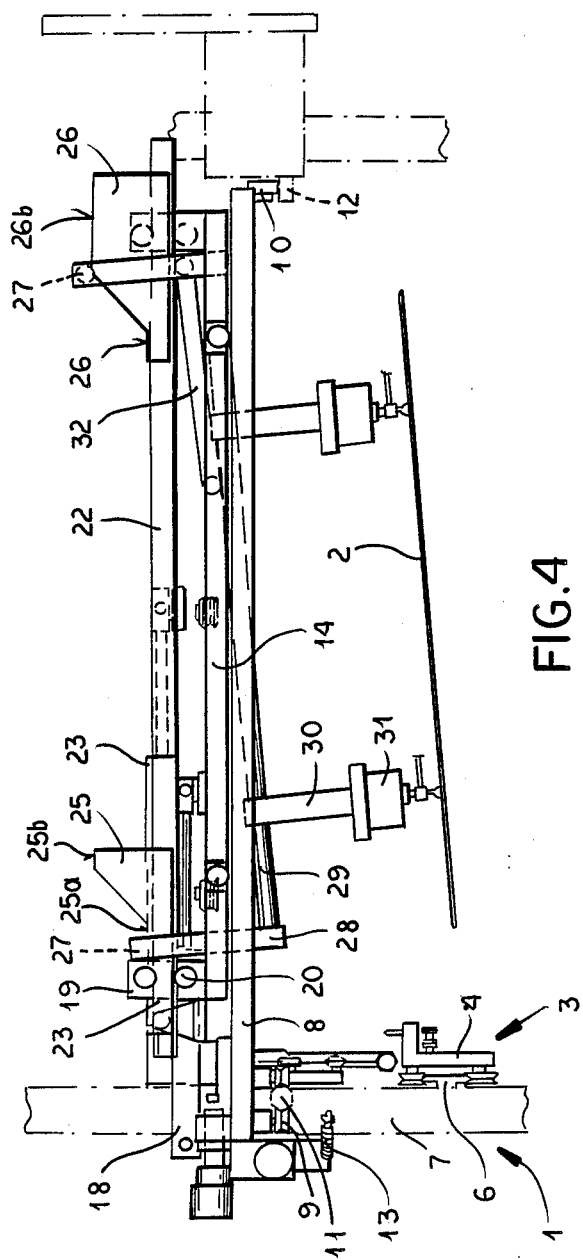
FIG. 4 is a view similar to FIG. 2 of the apparatus in a first stage of picking up a sheet.

In this way frame 28 and sheet 2 raised thereby take up an oblique position for a certain period in the course of being raised, as illustrated in FIG. 4, and this brings about the detachment of any other sheets which adhere to picked-up sheet 2.

In fact in an oblique position a component of the weight of the surplus sheet or sheets picked up beneath the intended sheet is directed parallel to the surfaces of the sheets, and therefore the surplus sheets can slide with respect to that held by pick-up members 31, overcoming or removing the cause of the undesired surface attachment of the surplus sheets.

Figure 5:
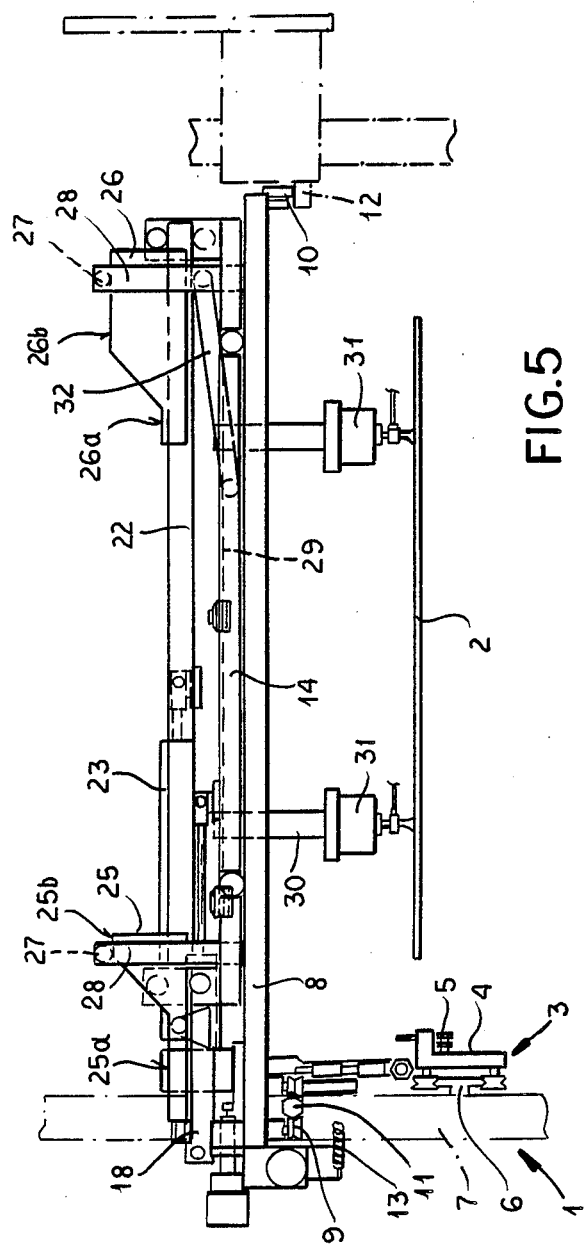
FIG. 5 is a view similar to FIG. 2 of the apparatus in a second stage of picking up a sheet.

At the end of the movement of third frame 22, as illustrated in FIG. 5, fourth frame 28 is in a raised position and controls movement of actuator 18 whereby second frame 14 supporting the third and fourth frame is moved in the direction of arrow $F_2$ to displace sheet 2 towards pulling member 3.

In this condition stop pin 41 carried by actuator 34 is then lowered to a level where this interferes with the movement of carriage 4 of conveyor unit 3.

In this condition therefore one of the carriages of conveyor 3, or, in the case of a conveyor of different configuration, a stop member provided for the purpose on the conveyor, enters into contact with pin 41 and therefore causes first frame 8 to be drawn along together with conveyor 3.

In this condition therefore one of the carriages of conveyor 3, or, in the case of a conveyor of different configuration, a stop member provided for the purpose on the conveyor, enters into contact with pin 41 and therefore causes first frame 8 to be drawn along together with the carriage 4 of the conveyor 3.

This therefore enables sheet 2 to be deposited on carriage 4 in a specific position, for example with the centering pins on the carriage entering corresponding holes in the sheet, or to engage the sheet between stops of various kinds, as requirements dictate. When the sheet has been laid on the conveyor carriage, pin 41 is caused to rise, thus releasing frame 8 from the conveyor so that this can be returned to the rearward position by spring 13 ready for a further pick-up operation.

The position at which pin 41 contacts carriage 4 may be adjusted by screw 36 so as to ensure that the sheet and carriage 4 meet at the same point in the direction of arrow $F_1$. The position in which the sheet is transferred to the carriage in the direction of arrow $F_2$ may also be adjusted accurately by adjusting the position of a limit stop 42 which is provided with a corresponding screw and knob 43, carried on the first frame and able to stop the travel of the second frame.

Figure 6:
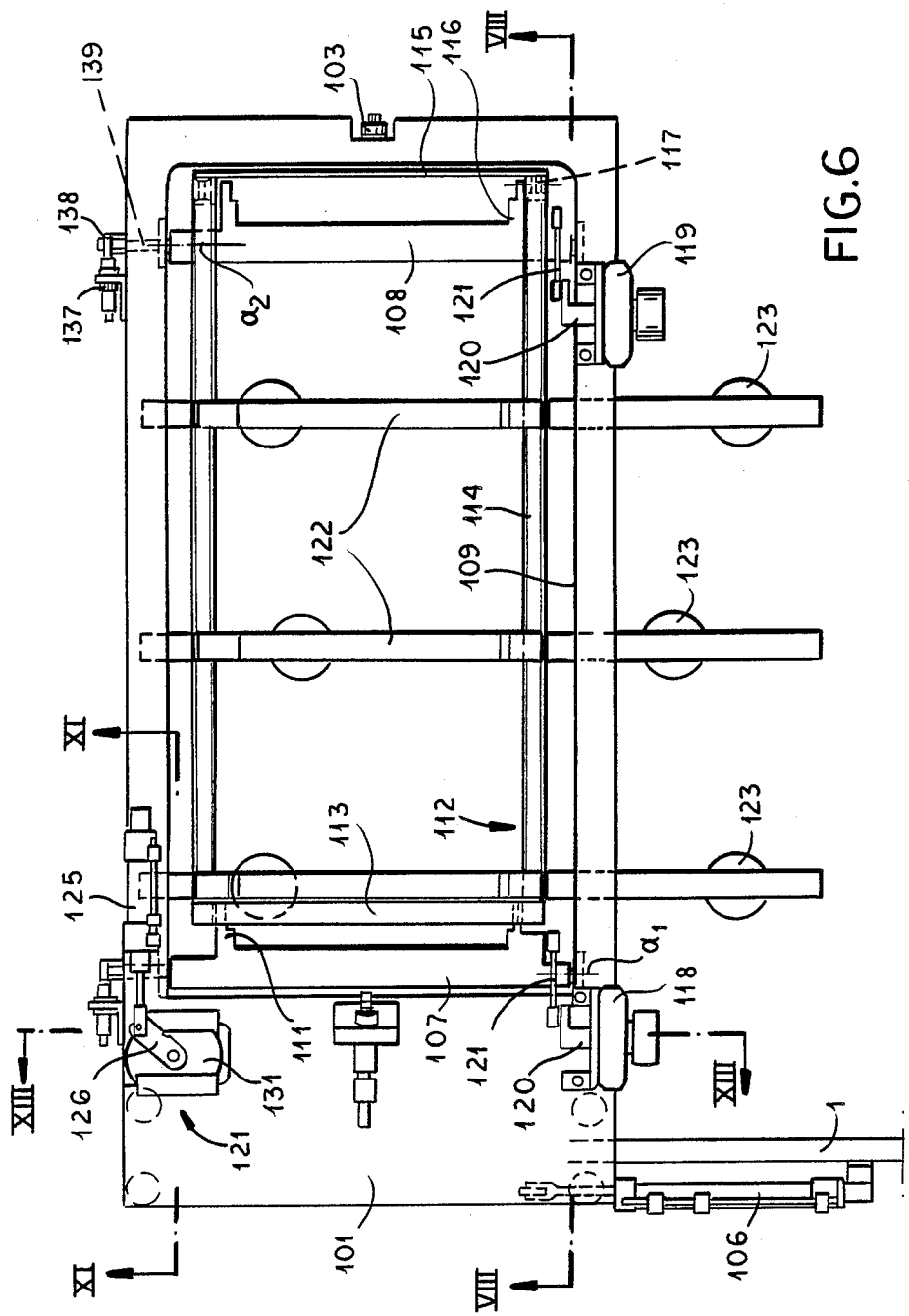
FIG. 6 is a plan view of the loading unit in an alternative embodiment.
Figure 7:
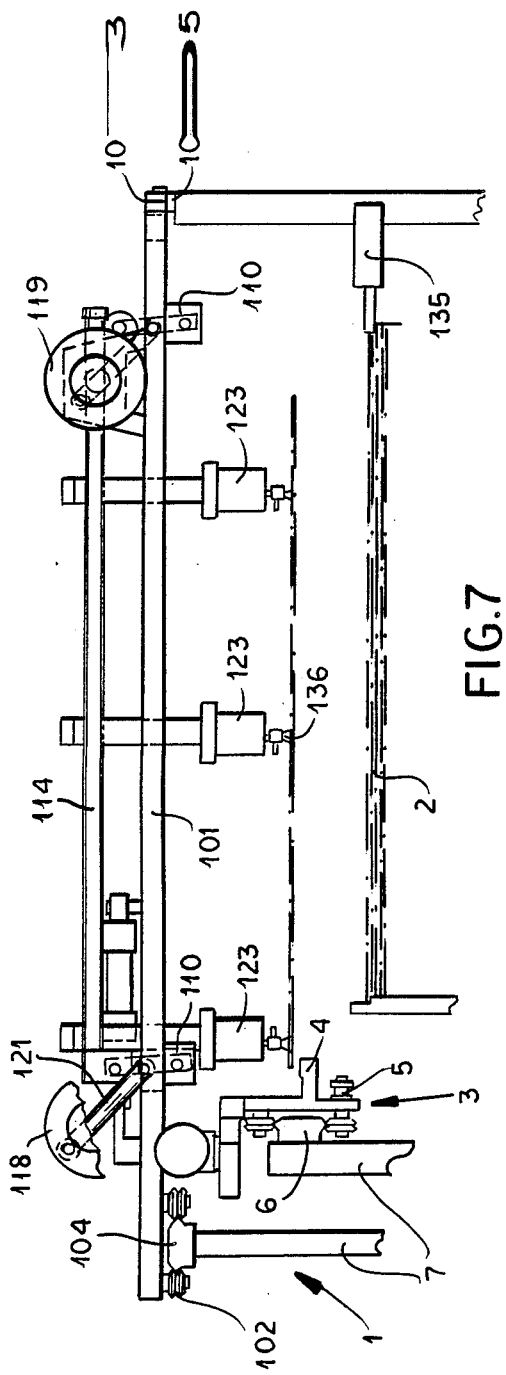
FIG. 7 is a side view of the loading unit of FIG. 6.
Figure 13:
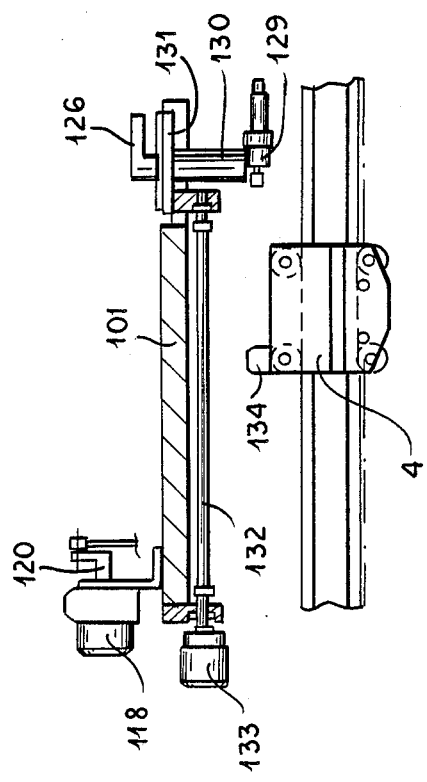
FIG. 13 is a section along line XIII—XIII in FIG. 6.

As FIGS. 6, 7 show, the automatic loading unit according to the invention, in an alternative embodiment illustrated in FIGS. 6 to 13, consists of a frame 101, of substantially rectangular shape, which can move by corresponding rollers 102, 103 on corresponding guide and support rails 104, 105 secured to the supporting frame 7 of the functional machine, having a direction parallel to the direction of advance of the carriage 4 of the conveyor 3.

Frame 101 is secured to supporting frame 7 by means of an acuator 106 which governs its controlled movement along rails 104, 105.

Frame 101 has rotatably linked thereto a pair of cross-members 107, 108 located within opening 109 in frame 101 and capable of rotation about axes $a_1$, $a_2$ respectively parallel to the direction of movement of carriages 4 supported by fins 110 on frame 101.

Arms 111 of cross-member 107 are connected by means of an articulated joint, having its axis parallel to axis a₁, to a second frame 112 consisting of a head cross-member 113 which is secured to rotatable cross-member 107, a pair of tubular bars 114, and a terminal cross-member 115.

Rotatable cross-member 108 bears grooved rollers 117 at the ends of its arms 116, in which grooves rest the tubular bars 114 of frame 112.

Two rotatable actuators 118, 119 are mounted on frame 101 and the rotating shafts thereof bear cranks 120 which are connected by means of connecting rods 121 to cross-members 107 and 108 respectively.

Alternatively actuators of a linear type connected to the cross-members to effect their corresponding rotations by means of cranks or similar members may be used, as indicated diagrammatically by way of example in FIG. 10 using dashed lines and identified by 118a.

To tubular bars 114 are connected a plurality of transverse supports 122, the positions of which can be adjusted, which bear pick-up members 123, of the suction cup or similar type, connected to a corresponding pneumatic unit, whereby the top sheet on the stack in the pick-up position can be lifted and held as it is moved laterally.

The rotation of actuators 118, 119 governs corresponding rotations of rotatable cross-members 107, 108, which move frame 112 from a pick-up position above sheet stack 2 to a setting-down position above conveyor member 3 in line with the corresponding adjustable means for securing sheet 2.

As shown in FIGS. 6, 11, 12 and 13, there is an engaging unit 124, consisting of an actuator 125 which actuates a rotating shaft 127 via a crank 126, the lower end of which has an arm support 128 bearing a stop member consisting essentially of a shock absorber 129, at its end.

Shaft 127 is mounted in a bushing 130 mounted on a slide 131 which can slide on frame 101 and whose position can be adjusted by means of rod 132 equipped with a corresponding knob 133.

When actuator 125 brings support 128 into the engaged position, as illustrated by solid lines in FIG. 12, shock absorber 129 lies in the path of knob projection 134 of carriage 4 and therefore comes into contact therewith, making frame 101 and carriage 4 integral in their movement in this condition. When support 128 is rotated in the release position, illustrated by a dashed and dotted line in FIG. 12, frame 101 is released from carriage 4.

A unit according to the invention operates starting with frame 101 in a rearward position with respect to the movement of conveyor member 3, while second frame 112 is in the pick-up position above a stack of sheets 2, from which the top sheet has to be picked up, as illustrated in FIG. 8.

Sheet stack 2 is supported by means of a constant level elevator unit of a known type which is not therefore described in detail. The elevator unit is conveniently provided with alignment actuators 135, one of which is illustrated diagrammatically in FIG. 7 and is designed to line up one or more top sheets in the stack against corresponding stop surfaces in order to ensure the accuracy of the position from which they are picked up.

In this position sheet or printed circuit 2a at the top of the stack is picked up by suction cup pick-up units 123 acting on its surface, suction cups 136 of these pick-up units being lowered through a short distance until they contact the sheet, as illustrated by dashed lines in FIG. 8.

From the initial position in FIG. 8, with the sheet suspended above the stack by units 123, actuator 119 is then first actuated causing cross-member 108 to rotate from a horizontal position to a substantially vertical position. In this way, through the action of rollers 117, frame 112 is lifted at one end, assuming the inclined position illustrated in FIG. 9.

In this way raised sheet 2a is for a short time during the pick-up procedure in an oblique position, as illustrated in FIG. 9, which ensures that any other sheets which adhere to picked up sheet 2 become detached.

In fact in the oblique position a component of the weight of the surplus sheet or sheets picked up under the intended sheet is directed parallel to the surface of the sheets, and therefore the surplus sheets can slide with respect to the sheet held by pick-up members 31, overcoming or removing the cause of the undesired surface attachment between the surplus sheets beneath sheet 2a.

The lifting up of the end of sheet 112 is detected by a sensor 137, activated by a rod 138 which is integral with shaft 139, rotating integrally with cross-member 108. If linear actuators are used instead of rotating actuators 118, 119 the sensor detecting completion of the actuator movement and therefore completion of the lifting of the end of frame 112 may be placed on the actuator itself.

Movement of actuator 118, whereby transverse member 107 is also rotated into a substantially vertical position, is then effected restoring frame 112 to the horizontal and at the same time moving it laterally towards conveyor 3, in order to place sheet 2 in an appropriate position for the arrival of carriage 4.

In this condition shock absorber 129 comes into contact with stop 134 of one of carriages 4 of conveyor unit 3 and causes frame 101 to be drawn along integrally with conveyor 3. During this stage when there is no relative movement between frame 101 and carriage 4 sheet 2a is deposited on carriage 4 in a specified position, for example with centering pins located on the carriage entering corresponding holes in the sheet, or engaging the sheet against stops of various kinds, according to requirements.

When the sheet has been deposited on the conveyor carriage shock absorber 129 is caused to rotate, thus releasing frame 101 from the conveyor. The conveyor then moves sheet 2a, which has become integral therewith, towards the functions which are to be performed, while frame 101 is returned into the rearward position by actuator 106, ready for a further pick-up operation.

The means for controlling position and activation of the actuators may be of a known type and are not therefore described in detail.

A plurality of variants may be introduced without thereby going beyond the scope of the general characteristics of the invention.

I claim:

1. A unit for the automatic loading of sheet units comprising:
   a conveyor having a direction of advance;
   a plurality of rails defining a track parallel to the direction of advance of the conveyor;
   a base frame movable on said rails;
   a second frame bearing one or more members for picking up said sheet units, carried by the base frame;

drive means for movement of said frames comprising means for moving said base frame parallel to said direction of advance, means for horizontal movement of said second frame in a direction perpendicular to the direction of movement of the base frame and means for vertical movement of said members, said means for horizontal and vertical movement together effecting displacement of said members between a pickup position overlying an area in which sheet units are accumulated and a setting-down position overlying the conveyor, in which extreme positions the sheet unit picked up lies substantially horizontal, with an intermediate position in which the sheet unit picked up lies at an inclined angle;

controllable means for translational coupling between the conveyor and the first frame, said base frame constituting a first flat frame, lying horizontally, which can be moved on respective rails parallel to the direction of advance of said conveyor, said first frame being equipped with a central opening within which are located two cross-members can rotate about axes parallel to the direction of advance of the conveyor, the cross-member closest to the conveyor being connected by means of an articulated joint, having its axis offset from the axis of rotation of the cross-member itself, to one end of a second frame bearing one or more members for picking up a sheet unit, the opposite end of the second frame resting slidably on the other cross-member in a position offset from the axis of rotation thereof, together with actuators which rotate independently of the cross-members through a predetermined angle for moving the pickup members linked by articulations to the cross-members vertically and horizontally between a pickup position above an area in which sheet units are accumulated and a setting-down position overlying the conveyor.

2. The apparatus according to claim 1 wherein the first frame is a flat member of substantially rectangular shape.

3. The apparatus according to claim 1 wherein the actuators effect rotation of the cross-members and are rotating actuators, each connected to the corresponding cross-member by means of a crank and connecting rod transmission.

4. The apparatus according to claim 1 wherein the actuators effect rotation of the cross-members and are linear actuators connected to the cross-members by appropriate transitional means to effect their rotation through the desired angle.

5. The apparatus according to claim 1, further comprising sensors which sense the rotation of a cross-member, detecting the completion of rotation through a predetermined arc, these sensors being able to control the movement of the actuator for the other cross-member.

6. A apparatus for an automatic destacking of sheet units piled in a stack, comprising:

conveying means advancing in a conveying direction for conveying sheet units;

a first frame displaceable reciprocatingly in a first plane and parallel to said conveying direction and operatively connected thereto, said first frame being movable in a direction parallel to the conveying direction, said first frame being provided with a central opening;

a pair of cross-members rotatable about respective parallel axes extending parallel to said conveying direction in said central opening, said cross-members being spaced apart;

a second frame formed with opposite sides on top of said first frame and movable reciprocatingly between a pickup position for pickup of the sheet units and a setting-down position for setting down said sheet units on said conveying means, said second frame in said pickup and setting-down positions lying in respective planes parallel to said first plane, one of said opposite sides of said second frame resting slidably on the respective one of said cross members, said second frame being provided with a plurality of picking-up members extending generally perpendicular to said first plane;

means for coupling the other side of said second frame with the respective cross-member and for applying a movement thereto in a direction perpendicular to said conveying direction, said second frame having an intermediate position between said pick-up and setting-down positions thereof and lying in a second plane in said intermediate position inclined with respect to said first plane; and first and second actuators operating independently of said pair of cross-members and operatively connected thereto, said second actuator causing the respective cross member with the respective side of said second frame resting slidably on said respective cross-member to rotate through a predetermined arc up to said intermediate tilting position of said second frame, said second frame being brought to said setting-off position thereof upon the operation of said first actuator.

7. The apparatus defined in claim 6 wherein said first frame has a rectangular shape formed with said central opening.

8. The apparatus defined in claim 6 wherein said first and second actuators are rotating actuators.

9. The apparatus defined in claim 6 wherein said first and second actuators are linear actuators.

10. The apparatus defined in claim 6 wherein said means for coupling the other side of said second frame with the respective cross-member is an articulated joint having its axis offset from said axis of the respective cross-member.

11. The apparatus defined in claim 6, further comprises means for sensing the rotation of said second cross-member through said predetermined arc and for controlling the operation of the first actuator.

12. The apparatus defined in claim 11, further comprises controllable means for translational coupling between said conveying means and said first frame, said conveying means being provided with a plurality of carriages spaced from one another.

13. The apparatus defined in claim 12 wherein said controllable means comprises:

an arm borne radially on a shaft rotatable about a vertical axis perpendicular to said direction of said conveying means, said arm having a first and second predetermined positions; and a respective stop member formed on each of said carriages, said arm engaging said stop member in said first position thereby forming a coupling between said first frame and said conveying means and disengaging said stop member in said second predetermined position allowing thereby free movement of the conveying means.

* * * * *